(12) United States Patent
Akai et al.

(10) Patent No.: US 8,693,150 B2
(45) Date of Patent: Apr. 8, 2014

(54) SEMICONDUCTOR APPARATUS

(75) Inventors: Kazumasa Akai, Ota (JP); Masahiro Nakahata, Ashikaga (JP)

(73) Assignees: Semiconductor Components Industries, LLC, Phoenix, AZ (US); Sanyo Semiconductor Co., Ltd., Gunma (JP)

( * ) Notice: Subject to any disclaimer, the term of this patent is extended or adjusted under 35 U.S.C. 154(b) by 524 days.

(21) Appl. No.: 12/958,256

(22) Filed: Dec. 1, 2010

(65) Prior Publication Data
US 2011/0128657 A1 Jun. 2, 2011

(30) Foreign Application Priority Data

Dec. 1, 2009 (JP) .................................. 2009-273810

(51) Int. Cl.
*H02H 9/00* (2006.01)
(52) U.S. Cl.
USPC ........................................................... 361/56
(58) Field of Classification Search
USPC ........................................................... 361/56
See application file for complete search history.

(56) References Cited

U.S. PATENT DOCUMENTS 7,554,777 B2 * 6/2009 Fukami ............................ 361/18

FOREIGN PATENT DOCUMENTS

| JP | H11-332089 A | 11/1999 |
|---|---|---|
| JP | 2005-93496 | 4/2005 |
| JP | 2006-121007 A | 5/2006 |
| JP | 2007-142423 | 6/2007 |
| JP | 2008-085125 A | 4/2008 |
| JP | 2009-152484 A | 7/2009 |
| JP | 2009-534845 A | 9/2009 |

OTHER PUBLICATIONS

Patent Abstracts of Japan for patent application with Publication No. 2005-093496, Publication Date: Apr. 7, 2005, 1 page.
Mechanical English translation for Japanese Patent Application with Publication No. 2005-093496, Publication Date: Apr. 7, 2005, 21 pages.
Patent Abstracts of Japan for patent application with Publication No. 2007-142423, Publication Date: Jun. 7, 2007, 1 page.
Mechanical English translation for Japanese patent application with Publication No. 2007-142423, Publication Date: Jun. 7, 2007, 15 pages.
Office Action issued in corresponding Japanese Application No. 2009-273810 dated Jan. 7, 2014 (2 pages).

* cited by examiner

*Primary Examiner* — Stephen W Jackson
(74) *Attorney, Agent, or Firm* — Osha Liang LLP

(57) ABSTRACT

A semiconductor apparatus includes: first and second power-supply terminals; an internal circuit connected between the first and second power-supply terminals; and a protection circuit connected in parallel with the internal circuit between the first and second power-supply terminals, the protection circuit including: a series circuit that includes a resistor and a first capacitor, and is connected in parallel with the internal circuit between the first and second power-supply terminals; a first MOS transistor that is connected in parallel with the series circuit, and is controlled according to a voltage at a connection point between the resistor and the first capacitor; and a switch circuit that is connected in parallel with the resistor, is turned on in a delayed manner after a power-supply voltage is applied between the first and second power-supply terminals, and changes the voltage at the connection point so that the first MOS transistor is turned off.

12 Claims, 5 Drawing Sheets

SEMICONDUCTOR APPARATUS

CROSS-REFERENCE TO RELATED APPLICATION

This application claims the benefit of priority to Japanese Patent Application No. 2009-273810, filed Dec. 1, 2009, of which full contents are incorporated herein by reference.

BACKGROUND OF THE INVENTION

1. Field of the Invention

The present invention relates to a semiconductor apparatus.

2. Description of the Related Art

A semiconductor apparatus such as an IC (Integrated Circuit) or an LSI (Large-Scale Integration) generally provided with an ESD protection circuit on the inside thereof and the outside thereof in order to prevent breakdown caused by ESD (Electro-Static Discharge). Especially, the ESD protection circuit provided on the inside of the semiconductor apparatus is mainly intended for prevention of ESD breakdown during handling before the semiconductor apparatus is mounted onto a circuit board.

For example, FIG. 13 of Japanese Laid-Open Patent Publication No. 2005-93496 discloses an ESD protection circuit (power supply terminal protection circuit) that includes an RC delay circuit, an inverter (inverting circuit), and an NMOS (N-channel Metal-Oxide Semiconductor) transistor. In the ESD protection circuit, a connection point between a resistor and a capacitor making up the RC delay circuit is connected through the inverter to a gate of the NMOS transistor for clamping a power supply terminal VDD and a ground terminal GND. If a surge voltage, which is positive on the side of the power supply terminal VDD, for example, is generated due to ESD, the NMOS transistor is kept ON during a period corresponding to a time constant of the resistor and the capacitor, so that the surge voltage is prevented from flowing through internal circuits other than the ESD protection circuit.

For example, FIG. 3 of Japanese Laid-Open Patent Publication No. 2007-142423 discloses an ESD protection circuit in which an RC-filter (corresponding to the RC delay circuit of Japanese Laid-Open Patent Publication No. 2005-93496) and an NMOS transistor are connected via three inverters connected in series. In the ESD protection circuit, the two inverters added to the ESD protection circuit make up a pre-driver that buffers an input to a gate of the NMOS transistor.

As such, the NMOS transistor is kept ON during a period corresponding to the time constant of the resistor and the capacitor, so that the surge voltage can be released, and thus the internal circuits of the semiconductor apparatus can be protected from the ESD breakdown.

In the ESD protection circuit as described above, the NMOS transistor is OFF at the time of energization while a power supply voltage is applied to the semiconductor apparatus, so that a malfunction is prevented. However, when the power supply voltage is not stable and changes, the NMOS transistor may be turned on as is the case with the ESD surge depending on a relationship between the abruptness of such a voltage change and the time constant of the resistor and the capacitor.

Therefore, the instantaneous change of the power supply voltage caused by noise, etc., may cause a malfunction of the semiconductor apparatus. Especially, in the case of a power supply IC for supplying power to other circuits, this problem may become prominent since stable power may not be supplied.

SUMMARY OF THE INVENTION

A semiconductor apparatus according to an aspect of the present invention, includes: a first power supply terminal and a second power supply terminal; an internal circuit connected between the first power supply terminal and the second power supply terminal; and a protection circuit connected in parallel with the internal circuit between the first power supply terminal and the second power supply terminal, the protection circuit including: a series circuit including a resistor and a first capacitor connected in series, the series circuit connected in parallel with the internal circuit between the first power supply terminal and the second power supply terminal; a first MOS transistor connected in parallel with the series circuit, the first MOS transistor configured to be controlled in accordance with a voltage at a connection point between the resistor and the first capacitor; and a switch circuit connected in parallel with the resistor, the switch circuit configured to be turned on in a delayed manner after a power supply voltage is applied between the first power supply terminal and the second power supply terminal and to change the voltage at the connection point so that the first MOS transistor is turned off.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

==Configuration of Semiconductor Apparatus==

A description will hereinafter be given of a configuration of a semiconductor apparatus including an ESD protection circuit according to an embodiment of the present invention, with reference to FIG. 1.

Figure 1:
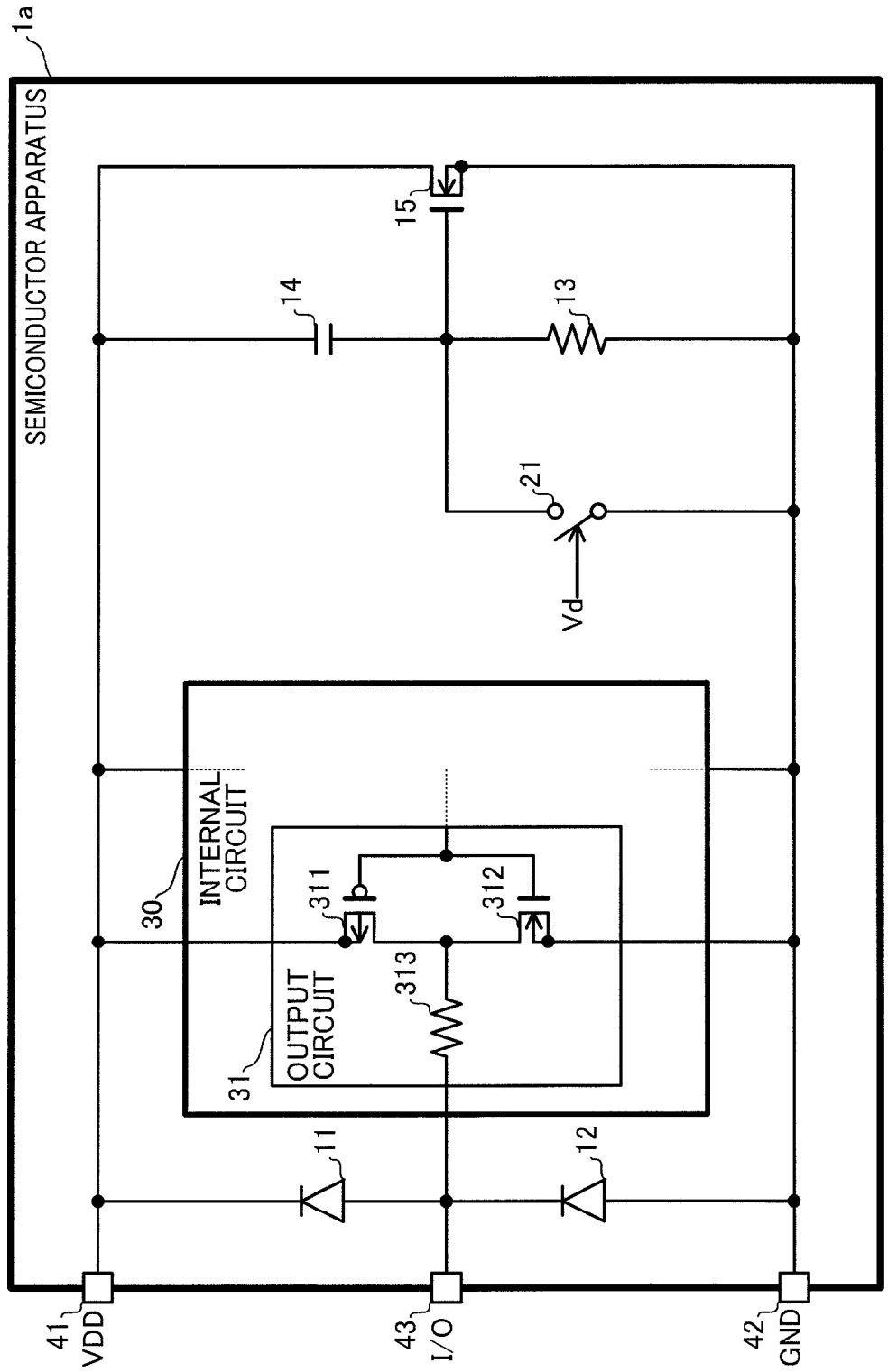
FIG. 1 is a circuit block diagram illustrating a configuration of a semiconductor apparatus including an ESD protection circuit according to one embodiment of the present invention.

A semiconductor apparatus 1a depicted in FIG. 1 is provided with terminals 41 to 43 and includes diodes 11, 12, a resistor 13, a capacitor 14, an NMOS transistor 15, a switch circuit 21, and an internal circuit 30.

The terminals 41 and 42 are a pair of power supply terminals to be applied with a power supply voltage and, for example, the terminals 41 and 42 correspond to a first power supply terminal and a second power supply terminal, respectively, for example. The terminal 43 is an input/output terminal for inputting/outputting signals. In the following description, it is assumed that a power voltage, which is positive on the side of terminal 41, is applied at the time of energization and the terminals 41 to 43 are referred to as a VDD terminal, a GND terminal, and an I/O terminal, respectively.

In the (first) diode 11, an anode thereof is connected to the I/O terminal and a cathode thereof is connected to the VDD terminal. In the (second) diode 12, an anode thereof is connected to the GND terminal and a cathode thereof is connected to the I/O terminal. Therefore, the diodes 11 and 12 are serially connected via the I/O terminal, and are applied with a reverse bias voltage at the time of energization.

The resistor 13 and the (first) capacitor 14 are serially connected; one end of the resistor 13 is connected to the GND terminal; and one end of the capacitor 14 is connected to the VDD terminal. A series circuit including the resistor 13 and the capacitor 14 corresponds to the RC delay circuit in Japanese Laid-Open Patent Publication No. 2005-93496 and the RC-filter in Japanese Laid-Open Patent Publication No. 2007-142423.

The drain of the NMOS transistor 15 (first MOS transistor) is connected to the VDD terminal and the source thereof is connected to the GND terminal. A connection point between the resistor 13 and the capacitor 14 is directly connected to a gate of the NMOS transistor 15.

The switch circuit 21 is connected in parallel with the resistor 13. The switch circuit 21 is turned on or off in accordance with a delay voltage Vd. The configuration of the switch circuit 21 will be described in detail later.

In an embodiment of the present invention, the internal circuit 30 includes a circuit other than the ESD protection circuit consisting of the diodes 11, 12, the resistor 13, the capacitor 14, the NMOS transistor 15, and the switch circuit 21, in the semiconductor apparatus 1a. The internal circuit 30 is supplied with the power supply voltage from the VDD terminal and the GND terminal. The internal circuit 30 also includes an input circuit and an output circuit for inputting/outputting signals from/to an external device (not shown) via the I/O terminal, and FIG. 1 depicts an output circuit 31 as an example.

The output circuit 31 includes a PMOS (P-channel MOS: P-channel metal-oxide semiconductor) transistor 311, an NMOS transistor 312, and a resistor 313, for example. The PMOS transistor 311 and the NMOS transistor 312 are serially connected between the VDD terminal and the GND terminal to make up a CMOS (complementary MOS: complementary metal-oxide semiconductor) inverter. An output end of the CMOS inverter is connected to the I/O terminal via the resistor 313.

==Example of Configuration of Switch Circuit==

A description will hereinafter be given of a configuration of the switch circuit 21 with reference to FIG. 2.

The switch circuit 21 includes a current source 211, a capacitor 212, an NMOS transistor 213, and a resistor 214, for example.

The current source 211 includes a current mirror circuit which is connected to the VDD terminal, for example. One end of the (second) capacitor 212 is connected to the GND terminal and the other end is supplied with a current from the current source 211 at the time of energization.

The NMOS transistor 213 (second MOS transistor) is connected in parallel with the resistor 13. A gate of the NMOS transistor 213 is applied with the delay voltage Vd that is a voltage across both ends of the capacitor 212. The gate of the NMOS transistor 213 is pulled down toward the GND terminal by the resistor 214.

==Operation of ESD Protection Circuit==

A description will then be given of an operation of the ESD protection circuit included in the semiconductor apparatus according to an embodiment of the present invention.

First, a description will be given of an operation in the case where the ESD surge voltage is applied to the power supply terminal at the time of non-energization while no power supply voltage is applied between the VDD terminal and the GND terminal such as during handling, with reference to FIG. 2.

In the non-energized state, the VDD terminal and the GND terminal are substantially equipotential in normal times. If ESD generates a surge voltage which is positive on the side of the VDD terminal, an electric charge is stored in the capacitor 14 by the surge voltage. The resistance value of the resistor 13 and the capacitance value of the capacitor 14 are set such that the time constant becomes sufficiently great relative to the ESD surge, and the NMOS transistor 15 is kept ON during a period corresponding to the time constant. During such an ON period, the surge current is prevented from flowing through the internal circuit 30 as indicated by an arrow A1 of a long dashed dotted line in FIG. 2, and the surge current is released to the NMOS transistor 15 as indicated by an arrow A2 of a solid line, thereby protecting the internal circuit 30 from ESD breakdown.

For example, in the EDS test of the IEC61000-4-2 standard, a rising time of ESD surge is less than 1 ns and the duration is on the order of several dozen ns to 100 ns. Therefore, as an example, when the resistance value of the resistor 13 is set at 100 kΩ and the capacitance value of the capacitor 14 is set at 1 pF, the time constant is set at 100 ns and a large portion of the surge current can be released to the NMOS transistor 15.

Figure 2:
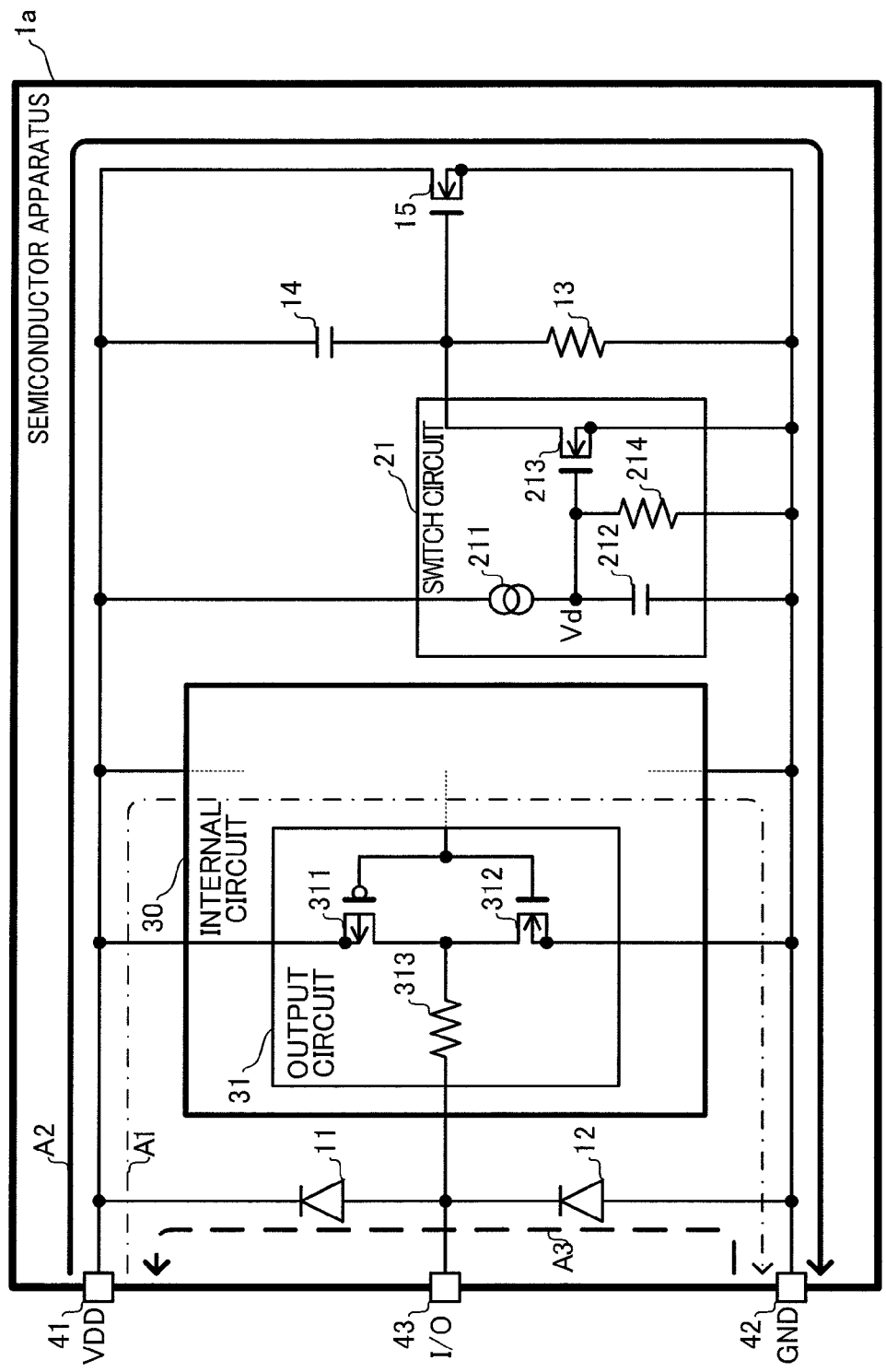
FIG. 2 is a diagram illustrating an example of a specific configuration of a switch circuit 21, as well as the diagram for explaining an operation of an ESD protection circuit when an ESD surge voltage is applied to a power supply terminal at the time of non-energization.

On the other hand, if ESD causes a surge voltage which is positive on the side of the GND terminal, the surge current flows toward VDD terminal via the diodes 12 and 11 as indicated by an arrow A3 of a long broken line in FIG. 2, thereby protecting the internal circuit 30 from the ESD breakdown.

Figure 3:
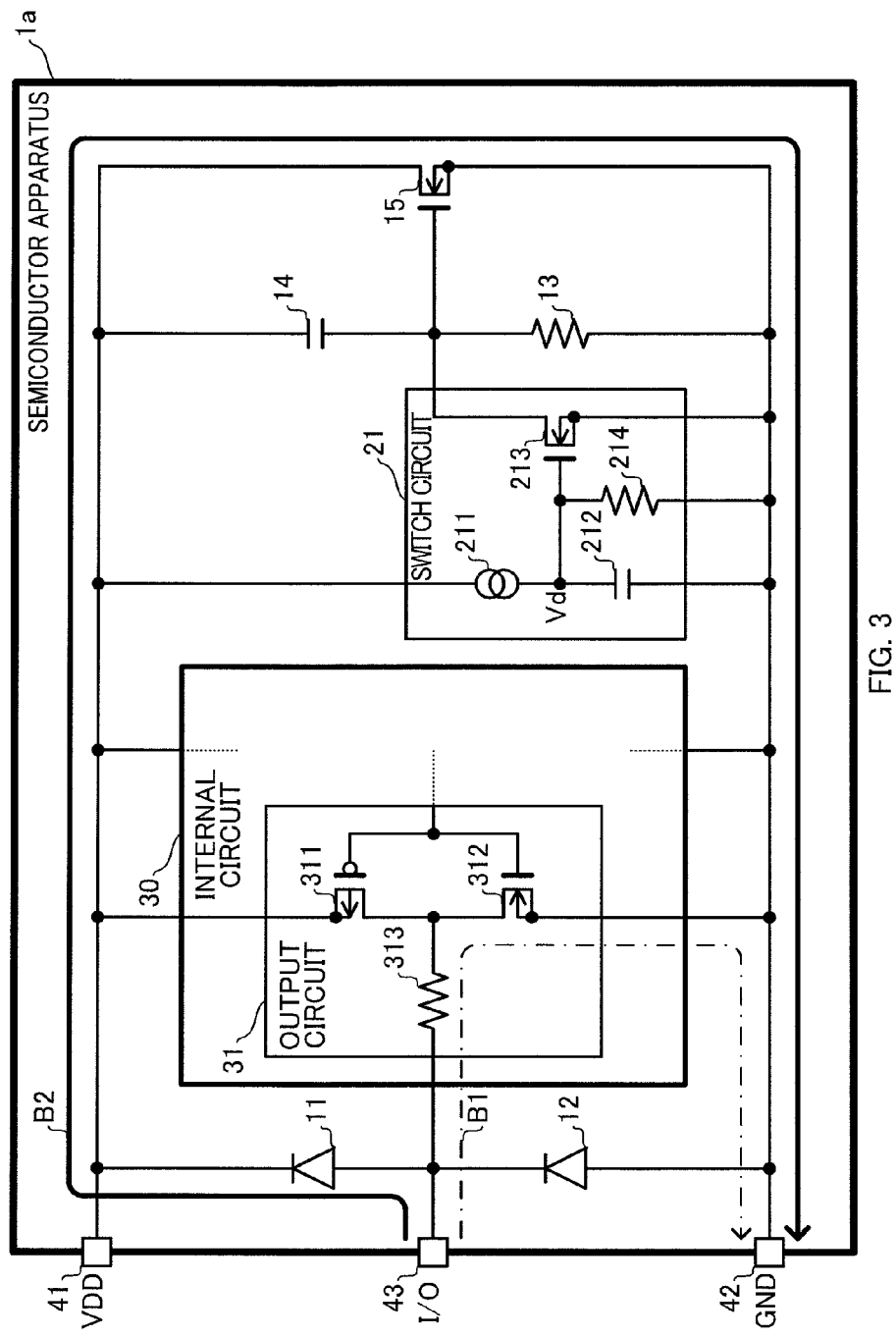
FIG. 3 is a diagram for explaining an operation of an ESD protection circuit when a positive ESD surge voltage is applied to an I/O terminal at the time of non-energization.
Figure 4:
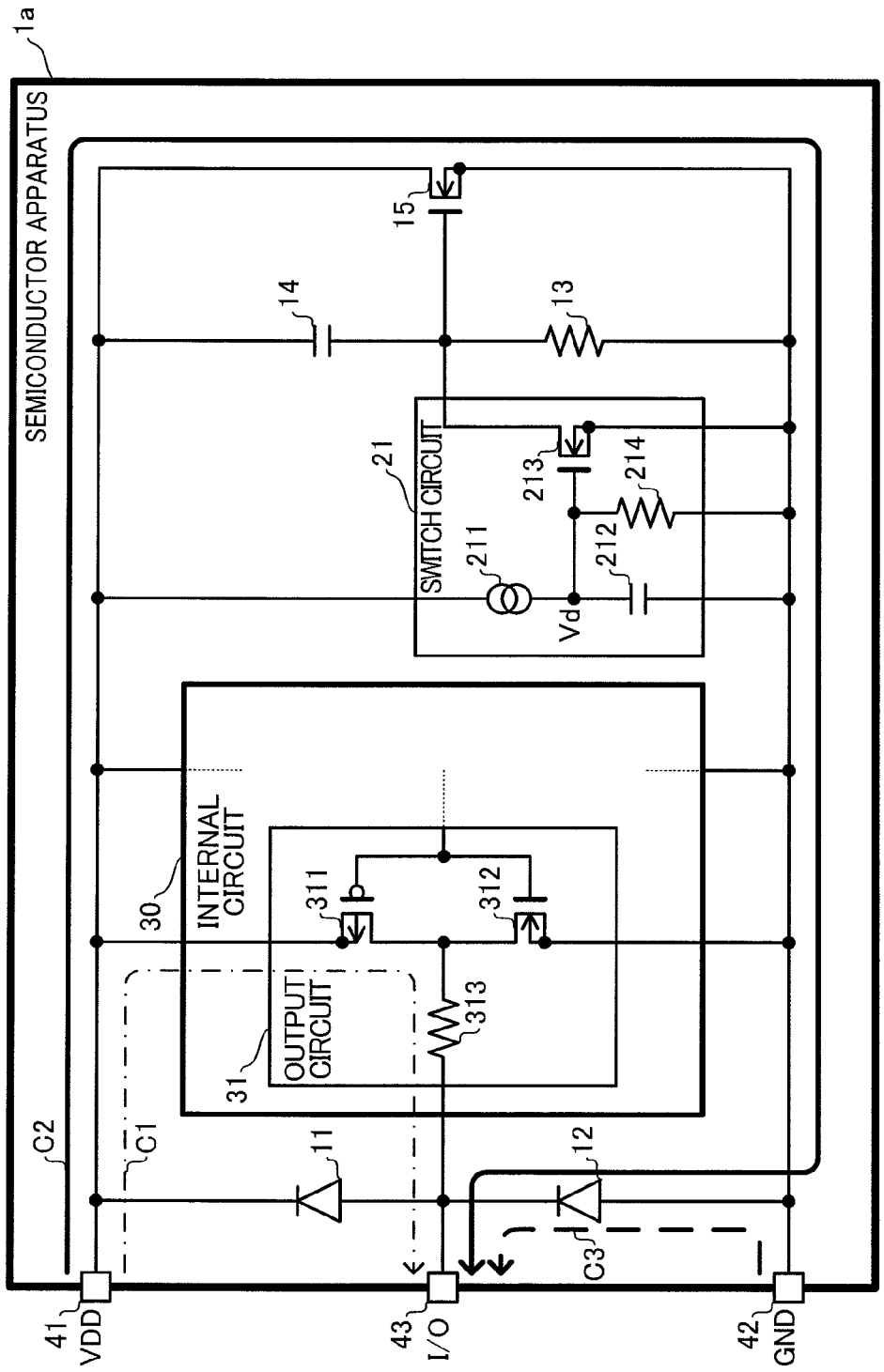
FIG. 4 is a diagram for explaining an operation of an ESD protection circuit when a negative ESD surge voltage is applied to an I/O terminal at the time of non-energization.

Description will then be given of an operation in the case where the ESD surge voltage is applied to the I/O terminal at the time of non-energization with reference to FIGS. 3 and 4.

At the time of non-energization, the I/O terminal is substantially equal in potential to the VDD terminal and the GND terminal at normal times. If ESD causes a surge voltage, which is positive on the side of the I/O terminal relative to the VDD terminal and the GND terminal, the surge current flows on the side of VDD terminal via the diode 11, and an electric charge is stored in the capacitor 14. Therefore, the NMOS transistor 15 is kept ON during a period corresponding to the time constant of the resistor 13 and the capacitor 14. During such an ON period, the surge current is prevented from flowing through the internal circuit 30 including the output circuit 31 as indicated by an arrow B1 of a long dashed dotted line in FIG. 3, and the surge current is released to the NMOS transistor 15 as indicated by an arrow B2 of a solid line, thereby protecting the internal circuit 30 from the ESD breakdown.

On the other hand, if ESD causes a surge voltage which is negative on the side of the I/O terminal relative to the VDD terminal and the GND terminal, this case is equivalent to the case where the surge voltage is caused which is positive on the side of the VDD terminal and the GND terminal relative to the I/O terminal. In this case, the surge current flows as indicated by an arrow C2 of a solid line and an arrow C3 of a long broken line in FIG. 4, and the surge current is prevented from flowing through the internal circuit 30 including the output circuit 31 as indicated by an arrow C1 of a long dashed dotted line, thereby protecting the internal circuit 30 from the ESD breakdown.

A description will then be made of an operation at the time of energization while the power supply voltage is applied between the VDD terminal and the GND terminal with reference to any of FIGS. 2 to 4.

Since the gate of the NMOS transistor 213 is pulled down toward the GND terminal by the resistor 214 before the power supply voltage is applied between the VDD terminal and the GND terminal, the NMOS transistor 213 is turned off.

On the other hand, when the power supply voltage is applied between the VDD terminal and the GND terminal, the current source 211 supplies a predetermined current to start charging the capacitor 212. The delay voltage Vd applied to the gate of the NMOS transistor 213 rises as the capacitor 212 is charged. When the delay voltage Vd rises to a predetermined voltage, the NMOS transistor 213 is turned on.

When the NMOS transistor 213 is turned on, the gate and source of the NMOS transistor 15 are short-circuited. For example, assuming that the on-resistance value of the NMOS transistor 213 is 5Ω, the time constant is set at about 5 ps for a parallel circuit including the resistor 13 and the switch circuit 21, and the capacitor 14. Therefore, such a malfunction can be prevented that the NMOS transistor 15 is turned on by the instantaneous change of the power supply voltage caused by noise, etc.

As described above, after the power supply voltage is applied between the VDD terminal and the GND terminal, the capacitor 212 is charged by a predetermined current supplied from the current source 211, and generates the delay voltage Vd. Therefore, the delay voltage Vd rises in a delayed manner after the power supply voltage rises and the switch circuit 21 can be turned on after the power supply voltage has completely risen, and thus the switch circuit 21 has no effect on the operation of the ESD protection circuit at the time of non-energization.

==Another Exemplary Configuration of ESD Protection Circuit==

Figure 5:
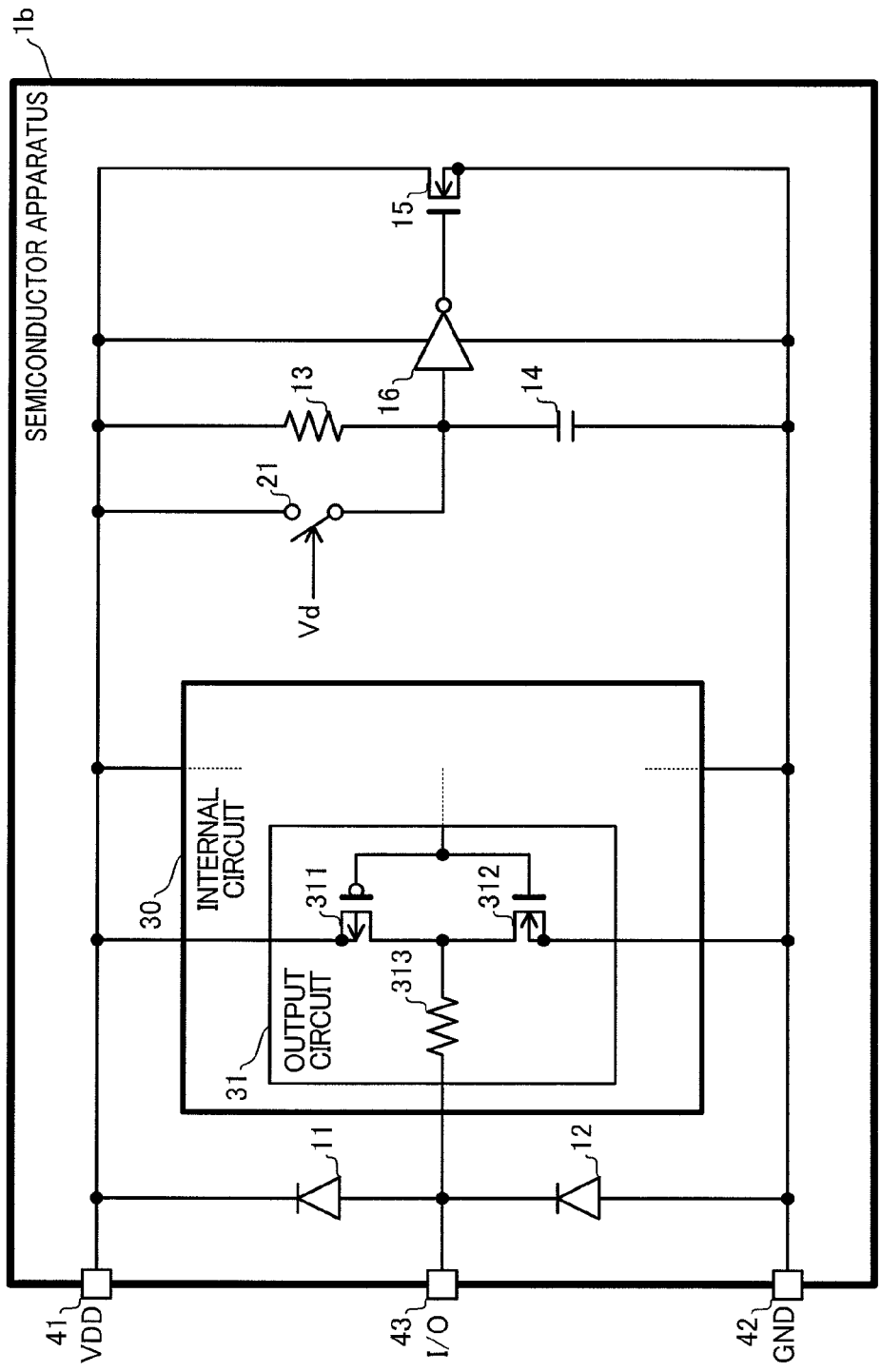
FIG. 5 is a circuit block diagram illustrating another exemplary configuration of an ESD protection circuit.

For example, as depicted in FIG. 5, the semiconductor apparatus of the present invention may have a configuration further including an inverter in the ESD protection circuit. The ESD protection circuit included in a semiconductor apparatus 1b depicted in FIG. 5 has a configuration with the resistor 13, the capacitor 14, and the switch circuit 21 inverted with respect a configuration FIG. 1. In this ESD protection circuit, the connection point between the resistor 13 and the capacitor 14 is connected to the gate of the NMOS transistor 15 via the inverter 16. The inverter 16 has a configuration similar to that of the CMOS inverter consisting of the PMOS transistor 311 and the NMOS transistor 312, for example.

The inverter 16 may be replaced by three inverters connected in series as is the case with FIG. 3 of Japanese Laid-Open Patent Publication No. 2007-142423. Further, a PMOS transistor may be used instead of the NMOS transistor 15 to make up a configuration with the connection of the resistor 13, the capacitor 14, and the switch circuit 21 inverted as needed.

As described above, in the ESD protection circuit included in the semiconductor apparatuses 1a and 1b, the resistor 13 and the capacitor 14 are connected in series between the VDD terminal and the GND terminal, the switch circuit 21, which is turned on after the power supply voltage is applied between the VDD terminal and the GND terminal, is connected in parallel with the resister 13, and the NMOS transistor 15, which is connected between the VDD terminal and the GND terminal, is kept off while the switch circuit 21 is turned on, so that the malfunction caused by the instantaneous change of the power supply voltage can be prevented with the internal circuit 30 being protected from the ESD breakdown.

The switch circuit 21 is configured such that a predetermined voltage is supplied to the gate of the NMOS transistor 213, which is connected in parallel with the resister 13, after the power supply voltage is applied, and thus, the switch circuit 21 can be turned on after the power supply voltage has completely risen, thereby preventing the malfunction without affecting the operation of the ESD protection circuit at the time of non-energization.

The capacitor 212 is charged by a predetermined current supplied from the current source 211 after the power supply voltage is applied and the delay voltage Vd is generated, so that it is possible that the delay voltage Vd is raised in an delayed manner after the rise of the power supply voltage, and the switch circuit 21 is turned on after the power supply voltage has completely risen.

The diodes 11 and 12 are connected between the I/O terminal and the VDD terminal and between the I/O terminal and the GND terminal, respectively, so that the reverse bias voltage is applied at the time of energization, so that the malfunction caused by the instantaneous change of the power supply voltage can be prevented while the internal circuit 30 being protected from the ESD breakdown, even if the ESD surge voltage is applied to the I/O terminal at the time of non-energization.

The connection point between the resistor 13 and the capacitor 14 is connected to the gate of the NMOS transistor 15 through at least one inverter 16, so that the NMOS transistor 15 can reliably be kept ON during the period corresponding to the time constant of the resistor 13 and the capacitor 14 and the surge current can be released to the NMOS transistor 15.

Although the current source 211 is connected to the VDD terminal and the power supply voltage, which is applied between the VDD terminal and the GND terminal, is directly used in an embodiment of the present invention, this is not limitative. As described above, in the semiconductor apparatus of the present invention, it is required that the delay voltage Vd must rise in a delayed manner after the power supply voltage rises so that the switch circuit 21 is turned on after the power supply voltage has completely risen. Therefore, the current source 211 may use an internal power supply generated by a power supply circuit within the semiconductor apparatus after the power supply voltage is applied.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A semiconductor apparatus comprising:
   a first power supply terminal and a second power supply terminal;
   an internal circuit connected between the first power supply terminal and the second power supply terminal; and
   a protection circuit connected in parallel with the internal circuit between the first power supply terminal and the second power supply terminal,
   the protection circuit including:
     a series circuit including a resistor and a first capacitor connected in series, the series circuit connected in parallel with the internal circuit between the first power supply terminal and the second power supply terminal;

a first MOS transistor connected in parallel with the series circuit, the first MOS transistor configured to be controlled in accordance with a voltage at a connection point between the resistor and the first capacitor; and a switch circuit connected in parallel with the resistor, the switch circuit configured to be turned on in a delayed manner after a power supply voltage is applied between the first power supply terminal and the second power supply terminal and to change the voltage at the connection point so that the first MOS transistor is turned off.

2. The semiconductor apparatus of claim 1, wherein the switch circuit includes:

a second MOS transistor connected in parallel with the resistor; and a voltage supply circuit configured to supply a predetermined voltage for turning on the second MOS transistor to a gate of the second MOS transistor, after the power supply voltage is applied between the first power supply terminal and the second power supply terminal.

3. The semiconductor apparatus of claim 2, wherein the voltage supply circuit includes:

a current source configured to supply a predetermined current after the power supply voltage is applied between the first power supply terminal and the second power supply terminal; and a second capacitor configured to be charged or discharged by the predetermined current and generate the predetermined voltage.

4. The semiconductor apparatus of claim 1 further comprising:

an input/output terminal; and first and second diodes connected between the input/output terminal and the first power supply terminal and between the input/output terminal and the second power supply terminal, respectively, the first and second diodes applied with a reverse bias voltage by the power supply voltage.

5. The semiconductor apparatus of claim 2 further comprising:

an input/output terminal; and first and second diodes connected between the input/output terminal and the first power supply terminal and between the input/output terminal and the second power supply terminal, respectively, the first and second diodes applied with a reverse bias voltage by the power supply voltage.

6. The semiconductor apparatus of claim 3 further comprising:

an input/output terminal; and first and second diodes connected between the input/output terminal and the first power supply terminal and between the input/output terminal and the second power supply terminal, respectively, the first and second diodes applied with a reverse bias voltage by the power supply voltage.

7. The semiconductor apparatus of claim 1 further comprising at least one inverter connected between the connection point and the gate of the first MOS transistor.

8. The semiconductor apparatus of claim 2 further comprising at least one inverter connected between the connection point and the gate of the first MOS transistor.

9. The semiconductor apparatus of claim 3 further comprising at least one inverter connected between the connection point and the gate of the first MOS transistor.

10. The semiconductor apparatus of claim 4 further comprising at least one inverter connected between the connection point and the gate of the first MOS transistor.

11. The semiconductor apparatus of claim 5 further comprising at least one inverter connected between the connection point and the gate of the first MOS transistor.

12. The semiconductor apparatus of claim 6 further comprising at least one inverter connected between the connection point and the gate of the first MOS transistor.

* * * * *